United States Patent [19]
Zangi

[11] Patent Number: 5,999,573
[45] Date of Patent: Dec. 7, 1999

[54] WIDEBAND CHANNELIZATION WITH VARIABLE SAMPLING FREQUENCY

[75] Inventor: Kambiz C. Zangi, Raleigh, N.C.

[73] Assignee: Ericsson Inc., Research Triangle Park, N.C.

[21] Appl. No.: 08/921,184

[22] Filed: Aug. 29, 1997

[51] Int. Cl.$^6$ ..................................................... H04J 1/00
[52] U.S. Cl. ........................... 375/316; 375/350; 370/210; 708/405
[58] Field of Search ..................................... 325/270, 277, 325/316, 321, 350, 355; 370/210; 708/402, 404, 405

[56] References Cited

U.S. PATENT DOCUMENTS

| | | | |
|---|---|---|---|
| 4,131,764 | 12/1978 | Claasen et al. | 370/210 |
| 5,323,391 | 6/1994 | Harrison | 370/210 |
| 5,396,489 | 3/1995 | Harrison | 370/210 |
| 5,535,240 | 7/1996 | Carney et al. | 375/219 |
| 5,848,097 | 12/1998 | Carney et al. | 375/219 |

OTHER PUBLICATIONS

Twicken, J.D., "A Generalized Polyphase Principle for Uniform Digital Filter Banks", IEEE 1988, pp. 1790–1793.

"A PSK Group Modem Based on Digital Signal Processing: Algorithm, Hardware Design, Implementation and Performance", *International Journal of Satellite Communicatons*, vol. 6 (1988), pp. 233–266.

Bellanger, Maurice G. and Daguet, Jacques L., "TDM–FDM Transmultiplexer: Digital Polyhase and FFT", IEEE, vol. COM–22, No. 9, Sep. 1974, pp. 1199–1205.

Karp, T. and Fliege, N.J., "MDFT Filter Banks With Perfect Reconstruction", Hamburg University of Technology, Telecommunication Institute, IEEE, 1995, pp. 744–747.

Baines, Rupert, "The DSP Bottleneck", IEEE, May 1995, pp. 46–54.

Vaidyanathan, P.P., "Multirate Digital Filters, Filter Banks, Polyphase Networks, and Applications: A Tutorial", IEEE, vol. 78, No. 1, Jan. 1990, pp. 56–93.

Corden, I.R. and Carrasco, R.A., "Fast Transform Based Complex Transmultiplexer Algorithm for Multiband Quadrature Digital Modulation Schemes", IEE Proceedings, vol. 137, Pt. 1, No. 6, Dec. 1990, pp. 408–417.

*Primary Examiner*—Young T. Tse
*Attorney, Agent, or Firm*—Jenkens & Gilchrist, P.C.

[57] ABSTRACT

A channelizer for processing a wideband signal to extract a plurality of narrowband signals is disclosed. The channelizer is capable of processing a received wideband signal to extract a plurality of regularly spaced narrowband signals therefrom. The wideband signal is processed in such a manner that the extracted narrowband signals have a sampling frequency that is not limited to an integer multiple of the channel spacing and is valid for any combination of downsampling factors and number of channels.

9 Claims, 4 Drawing Sheets

WIDEBAND CHANNELIZATION WITH VARIABLE SAMPLING FREQUENCY

BACKGROUND OF THE INVENTION

1. Technical Field of the Invention

The present invention relates to wideband channelization techniques, and more particularly, to a method of wideband channelization wherein the sampling frequency of extracted channels is not limited to an integer multiple of the channel spacing within a filter bank channelizer.

2. Description of Related Art

Radio receivers requiring simultaneous reception of multiple radio channels require the extraction of a number of radio signals from a single wideband signal. Such receivers may include macro base stations, micro base stations, pico base stations and others.

Presently, radio channels extracted from a wideband signal using a filter band channelizer have a sampling frequency $f_s$ that is restricted to an integer multiple of the channel spacing. In many applications, such as cellular radio, it is highly desirable for the sampling frequency to be an integer multiple of the symbol rate (i.e., not an integer multiple of the channel spacing). One solution to this problem is to feed each output of a channelizer to a digital sample rate converter to convert the sample rate of the output to an integer multiple of the symbol rate. However, having a digital sample rate converter on each output channel of a channelizer increases the cost, complexity and power consumption of a receiver. A method for directly providing a sampling frequency that is an integer multiple of the symbol rate without increasing cost, complexity and power consumption of the receiver would be highly desirable.

SUMMARY OF THE INVENTION

The present invention overcomes the foregoing and other problems with a method and apparatus enabling computationally efficient channelization of a wideband signal wherein the extracted narrowband signals have a sampling frequency that is not limited to an integer multiple of the channel spacing, and have a sampling rate that is an integer multiple of the symbol rate. A wideband signal is input to the channelizer wherein a plurality of M polyphase filters having decimators on the input sides thereof extract a first sequence of signals from the received wideband signal.

The extracted first sequence of signals is processed by an M-point Inverse Discrete Fourier Transform (IDFT) to calculate the IDFT coefficients of the first sequence of signals. The calculated IDFT coefficients are modulated with a carrier signal sequence to shift the desired narrowband signals to baseband. The channelizer is valid for any combination of down sampling factors and number of narrowband channels.

BRIEF DESCRIPTION OF THE DRAWINGS

For a more complete understanding of the present invention, reference is made to the following detailed description taken in conjunction with the accompanying drawings wherein.

DETAILED DESCRIPTION OF THE INVENTION

Figure 1:
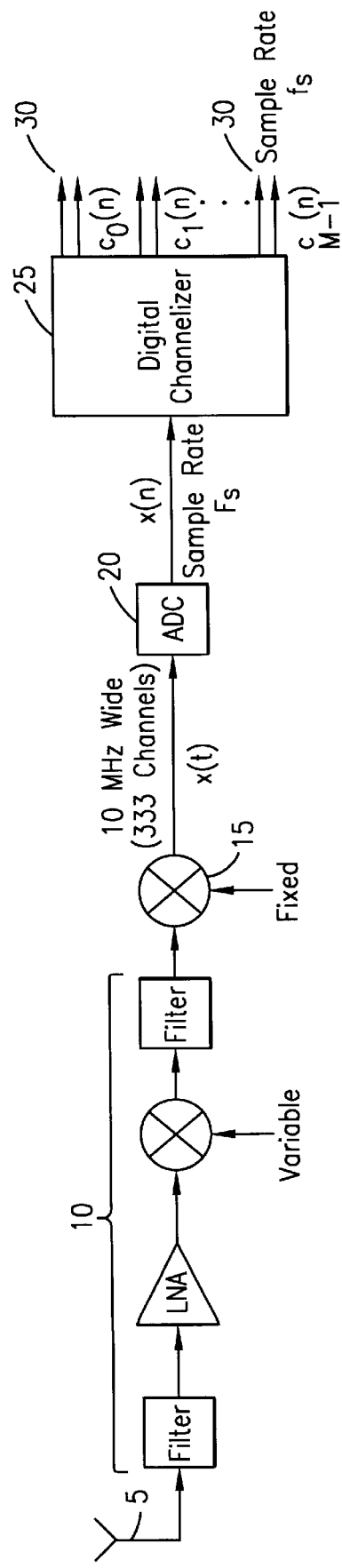
FIG. 1 is a block diagram of a generic wideband receiver.

Referring now to the drawings, and more particularly to FIG. 1, there is illustrated a block diagram of a generic wideband receiver. A transmitted wideband signal is received at an antenna 5. Through several stages of mixing and filtering (shown generally at 10), the signal is processed to a desired frequency band, and is then mixed down at a mixer 15 to a baseband signal x(t) with relatively wide bandwidth for input to a wideband analog-to-digital converter 20. The analog-to-digital converter 20 converts the analog baseband signal x(t) to a digital wideband signal x(n) which is processed by a digital channelizer 25 to extract various radio channels 30. The sampling rate of the A/D converter 20 is $F_s$. Existing DFT-channelizers 25 provide a method manner for extracting every channel within the wideband signal from the digital wideband signal x(n).

Figure 2:
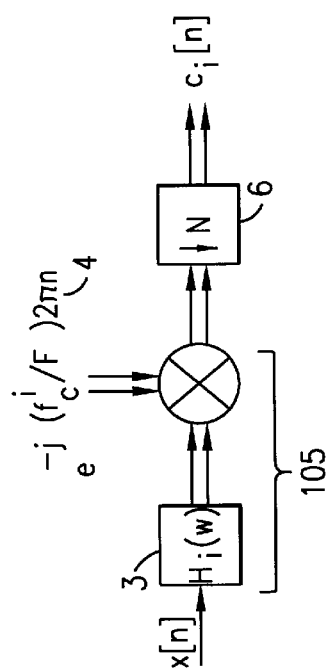
FIG. 2 is a functional diagram of one branch of a DFT-channelizer having an input sample rate of $F_s$ and output sample rate of $f_s$.

Referring now to FIG. 2, there is illustrated a functional diagram of a branch of a DFT-channelizer. $h_o(n)$ defines a real, lowpass FIR filter 105. Every other filter within a filter bank of a DFT channelizer is a modulated version of this lowpass prototype FIR filter (i.e., $$H_i(w) = H_o\left(w - \frac{2\pi}{M}i\right);$$

$0 \leq i \leq M-1$; where M is the total number of narrowband channels in the wideband signal x(n)). In the branch of FIG. 2, $H_i(w)$ represents a bandpass filter centered on the discrete time frequency $$\frac{2\pi}{M}i$$

(where i is the branch of the filter bank), or equivalently centered on the continuous time frequency $$\frac{F_s}{M}i$$

(where $F_s$ equals the symbol rate of the wideband signal x(t)). In other words there are exactly M equal bandwidth filters in the filter bank, and these filters are centered exactly at integer multiples of the channel spacing ($f_{cs}$) for $$f_{cs} = \frac{F_s}{M}.$$

Mathematically, the relationship between $F_s$, M and $f_{cs}$ is $F_s = M \times f_{cs}$. The filter bank in FIG. 2 can be implemented using an inverse discrete Fourier transform (IDFT) and the polyphase decomposition of the lowpass prototype filter $h_i(n)$. This implementation is typically referred to as a DFT-channelizer.

Figure 3:
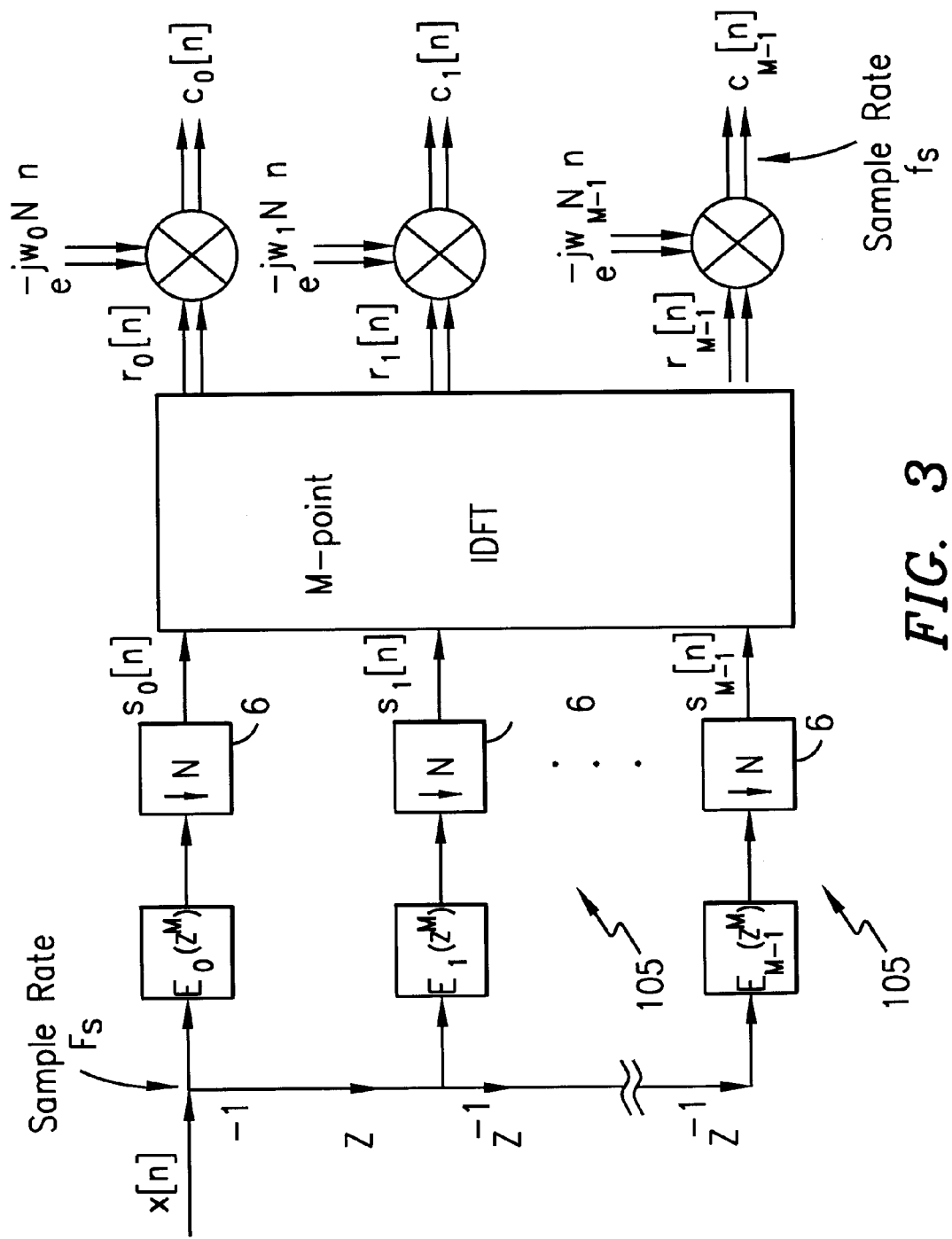
FIG. 3 illustrates a DFT-channelizer valid for any M and N having an input sample rate of $f_s$ and output sample rate of $f_s$.

Referring now to FIG. 3, there is illustrated a block diagram of a DFT-channelizer, where the i-th branch of the DFT-channelizer implements the system of FIG. 2. In FIG. 3, $E_i(z^k)$ represents the i-th polyphase component of filter response $H_o(z)$, where $H_o(w)=H_o(z)$, $Z=e^{jw}$; $E_i(Z)$ is the Z-transform of $e_i(n)$; and $H_o(z)$ is the Z-transform of $h_o(n)$ $$H_o(z) = \sum_{i=o}^{M-1} z^{-i} E_i(z^M)$$

where: $e_i(n) = h_o[nm + i] \quad o \le i \le M - 1$

For computational efficiency, in the implementation of the DFT-channelizer depicted in FIG. 4, it would be highly desirable to move the decimators 6 to the left of the polyphase filters 105, so that the polyphase filters would operate at the lowest sampling rate in the system. However, this move can only be made if M is an integer multiple of N (i.e., M=N×K; where K is same positive integer), where N represents the downsampling factor. Unfortunately, with M=N×K, the sampling rate of output channel $f_s$ is always an integer multiple of the channel spacing (i.e., $f_s=K\times f_{cs}$). As explained before, in many communications applications, it is highly desirable to have $f_s$ which is a small integer multiple of the symbol rate which is not necessarily an integer multiple of the channel spacing. Requiring $f_s$ to be an integer multiple of the channel spacing and an integer multiple of the symbol rate, typically forces $f_s$ to be a very large multiple of the symbol rate. For example, in a D-AMPS cellular mobile communication standard, the symbol rate is 24.3 KHZ and the channel spacing is 30 KHZ. Thus, the smallest $f_s$ that is an integer multiple of both these rates would be 2.43 MHZ, i.e. 100 times the symbol rate.

By modifying the traditional implementation of the DFT-channelizer illustrated in FIG. 3, the decimator 6 can be moved to the left of the polyphase filters 105 for any value of M and N. A computationally efficient channelizer may be constructed this way in which the sampling frequency $f_s$ of the output is a small integer multiple of, for instance, the symbol rate.

Assuming, for illustration purposes, that each polyphase filter of FIG. 3 has two non-zero coefficients, the i-th polyphase filter may be expressed by the equation $E_i(z^M)= E_{i,o}+Z^{-M}E_{i,1}$ (where $E_{i,o}$ equals $h_o[i]$, $E_{i,1}$ equals $h_o[M+i]$. However, it should be realized that this process can be generalized to polyphase filters with any number of non-zero coefficients. The key step is moving the decimators 6 to the left of the polyphase filters 105.

Figure 4A:
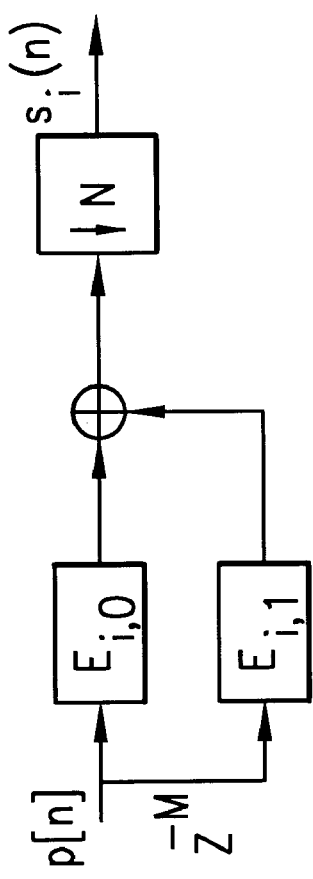
FIGS. 4a and 4b illustrate a novel implementation of the i-th polyphase branch valid for any M and N.
Figure 4A:
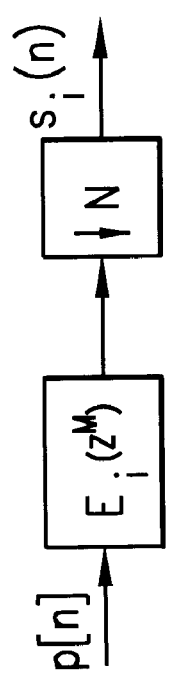
Figure 4B:
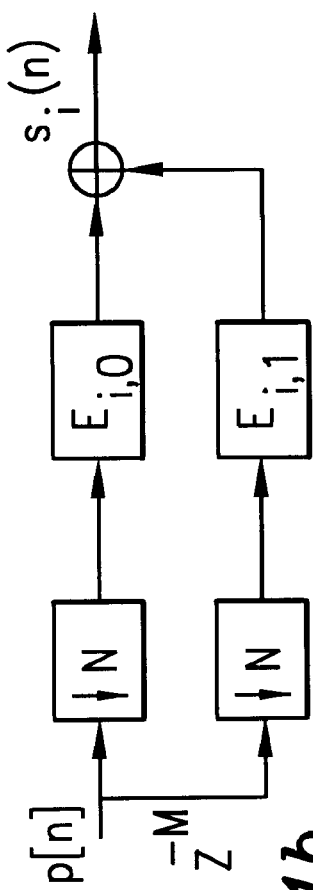
Figure 4B:
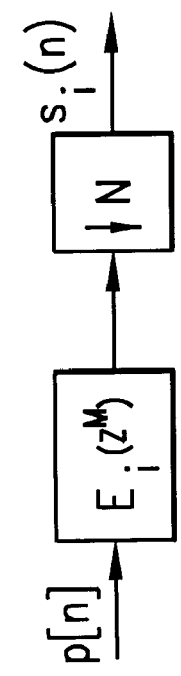
Figures 5, 6:
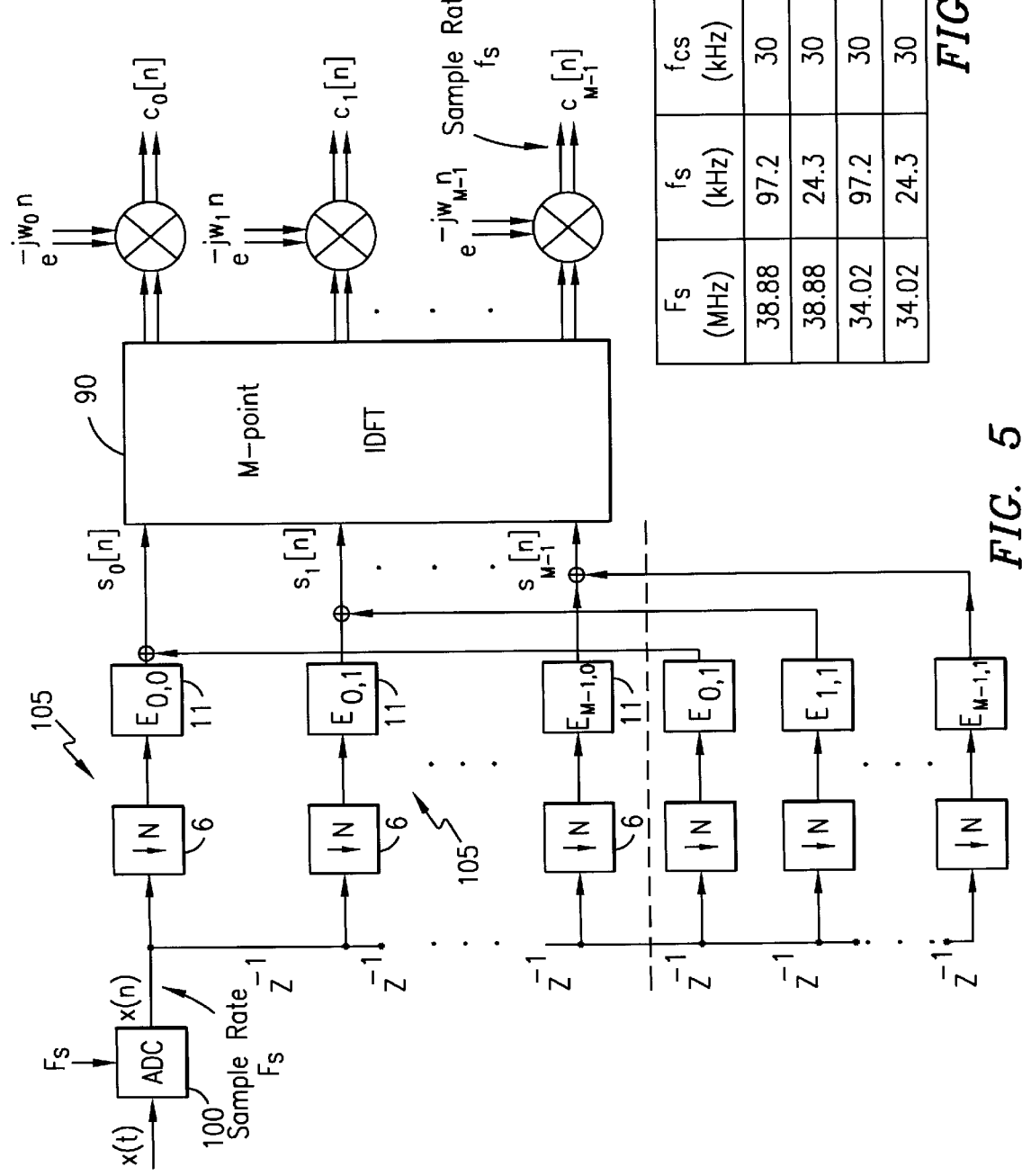
FIG. 5 illustrates a modified and computationally efficient DFT-channelizer valid for any M and N having an input sample rate of $F_s$ and output sample rate of $f_s$.
FIG. 6 is a table illustrating the associated parameters for several values of $F_s$ within a channelizer designed according to the present invention.

The method for moving the decimator 6 to the left of the polyphase filters 105 when the number of channels M is not an integer multiple of the downsampling factor N is accomplished in the following manner. The i-th branch of the polyphase filters 105 in FIG. 3 may be expressed as shown in FIG. 4a. FIG. 4a illustrates that decimator 6 may be moved to the left of gains (which combined are equal to $E_i(z^M)$ in accordance with $E_i(z^M)=E_{i,o}+z^{-M}E_{i,1}$), even if M is not an integer multiple of N since $E_{i,o}$ and $E_{i,1}$ are pure gains. This provides the structure illustrated in FIG. 4b. By applying the identity of FIG. 4b to each branch of the filter bank illustrated in FIG. 3, a modified DFT-channelizer valid for any M and N as shown in FIG. 5 is created. The channelizer of FIG. 5 is valid for any M and N and not only for M=N×K.

Given a desired channel spacing $f_{cs}$ and a desired sampling frequency $f_s$ of the output channels, the constraint that the bandwidth of the wideband signal $F_s=M\times f_{cs}$ combined with $$f_s = \frac{F_s}{N}$$

implies that the sampling rate of the A/D Converter $F_s$ is an integer multiple of both the output sampling frequency $f_s$ and channel spacing $f_{cs}$. The smallest such $F_s$ is the least common multiple of $f_s$ and $f_{cs}$ (denoted by LCM ($f_s$, $f_{cs}$)). Any integer multiple of LCM ($f_s$, $f_{cs}$) is also a valid symbol rate $F_s$. For example, in the D-AMPS standard for cellular mobile communication, $f_s$=24.3 kHz and $f_{cs}$=30 kHz, the smallest valid symbol rate $F_s$ is 2.43 MHz. However, the symbol rate $F_s$ must be large enough to avoid aliasing in sampling x(t). For a 10 MHz wide x(t), any symbol rate $F_s$ larger than 20 MHz would avoid aliasing. The table in FIG. 6 summarizes the parameters of the modified DFT-channelizer for several valid values of sampling rate of the A/D converter $F_s$ of the wideband signal x(t) and several down sampling factors N.

The modified DFT-channelizer of FIG. 5 receives the digitized wideband signal x(n) from the analog-to-digital converter 100 and extracts various channels using polyphase filters 105 consisting of decimator 6 and gains 11. The filtered channels are combined to yield a first signal sequence $S_f(n)$. The first signal sequence $S_f(n)$ is then provided to a M-point inverse discrete fourier transform (IDFT) 90 to generate a plurality of IDFT coefficients. The IDFT coefficients are modulated by a carrier signal $e^{-jw_jn}$ to provide the output channels $C_f(n)$, where the sampling rate of $C_f(n)$ in $f_s$.

The M-point IDFT 90 in the modified DFT-channelizer can be computed using any known fast algorithm for computing DFT/IDFT. These algorithms include the radix-2 FFT (fast fourier transform) algorithm, the Cooley-Tukey FFT algorithm, the Wionogard prime-length FFT algorithm, and the prime-factor FFT algorithm. Depending on the exact value of M, a particular algorithm for computation of the IDFT might be more efficient. Hence, the free parameters of the subsampled DFT-channelizer (e.g., $F_s$ and M) can be chosen such that the resulting IDFT can be computed more efficiently using a particular FFT/IFFT (inverse fast fourier transform) algorithm. In other words, these parameters can be chosen to get an IDFT size that can be computed efficiently.

For example, if M is a highly composite number, the Cooley-Tukey FFT algorithm can be used to efficiently compute the resulting IDFT. On the other hand, if M is a prime number, the Winograd prime-length FFT algorithm can be used to efficiently compute the resulting IDFT. Finally, if M has powers of four, the radix-4 FFT algorithm can be used to efficiently compute the resulting IDFT.

The architecture for a subsampled DFT-channelizer described in commonly assigned, Co-Pending Application, U.S. Ser. No. 08/921,186, (Attorney Docket No. 27951-160), entitled Wideband Channelization using Subsampled Discrete Fourier Transformers, which is incorporated herein by reference, can easily be used with polyphase filters of any definite length. With polyphase filters of length. There will be vertical sections between the output of the analog-to-digital converter 100 and the M-point IDFT 90. Each of these vertical sections is similar to the section below the dotted line in FIG. 6.

Although a preferred embodiment of the method and apparatus of the present invention has been illustrated in the accompanying Drawings and described in the foregoing Detailed Description, it is understood that the invention is not limited to the embodiment disclosed, but is capable of numerous rearrangements, modifications, and substitutions without departing from the spirit of the invention as set forth and defined by the following claims.

What is claimed is:

1. A receiver, comprising:
   means for converting a received signal to an analog baseband signal;
   an analog-to-digital converter for converting the analog baseband signal to a digital wideband signal; and
   a channelizer for extracting narrowband signals from the digital wideband signal, the channelizer comprising:
      a plurality of polyphase filters for extracting a first sequence of signals from the digital wideband signal,
      a decimator located within each polyphase filter and connected to an input side of each of the plurality of polyphase filters;
      a M-point Inverse Discrete Fourier Transform (IDFT) for calculating IDFT coefficients from the extracted first sequence of signals; and
      a modulator for modulating the IDFT coefficients with a carrier signal sequence to generate the narrowband signals.

2. The receiver of claim 1 wherein the sampling frequency of the extracted narrowband signals is equal to an integer multiple of a symbol rate of the received signal.

3. The receiver of claim 1 wherein the channelizer is valid for any number of narrowband channels and any downsampling factor.

4. A channelizer for processing a wideband signal comprising:
   means for receiving the wideband signal;
   means for extracting narrowband signals from the wideband signal, wherein a sampling frequency for the narrowband signals is not limited to an integer multiple of channel spacing, the means for extracting comprising:
      a plurality of polyphase filters for extracting a first sequence of signals from the received wideband signal;
      a decimator located within each polyphase filter and connected to an input side of each of the plurality of polyphase filters;
      a M-point Inverse Discrete Fourier Transform (IDFT) for calculating IDFT coefficients from the extracted first sequence of signals; and
      a modulator for modulating the IDFT coefficients with a carrier signal sequence to generate the narrowband signals; and means for outputting the extracted narrowband signals.

5. The channelizer of claim 4 wherein the sampling frequency of the extracted narrowband signals is equal to an integer multiple of a symbol rate.

6. The channelizer of claim 4 wherein the channelizer is valid for any number of narrowband channels and any downsampling factor.

7. A channelizer for processing a wideband signal, comprising:
   means for receiving the wideband signal;
   means for extracting narrowband signals from the wideband signal for any combination of downsampling factor and number of narrowband channels, the means for extracting comprising:
      a plurality of polyphase filters for extracting a first sequence of signals from the received wideband signal;
      a decimator located within each polyphase filter and connected to an input side of each of the plurality of polyphase filters;
      a M-point Inverse Discrete Fourier Transform (IDFT) for calculating IDFT coefficients from the extracted first sequence of signals; and
      a modulator for modulating the IDFT coefficients with a carrier signal sequence
      to generate the narrowband signals; and
      means for outputting the extracted narrowband signals.

8. A method for processing a wideband signal including a plurality of narrowband channels, comprising the steps of:
   receiving the wideband signal including the plurality of narrowband channels;
   extracting the plurality of narrowband channels at a sampling rate that is not limited to an integer multiple of channel spacing, the step of extracting the plurality of narrowband channels further including the steps of:
      extracting a first sequence of signals through a plurality of polyphase filters having a decimator located on an input side of each of the plurality of polyphase filters;
      calculating IDFT coefficients from the extracted first sequence of signals; and
      modulating the IDFT coefficients with a carrier signal sequence to generate the plurality of narrowband channels; and
   outputting the plurality of narrowband channels.

9. The method of claim 8 wherein the sampling rate equals an integer multiple of a symbol rate.

* * * * *